(12) United States Patent
Son et al.

(10) Patent No.: US 11,960,236 B2
(45) Date of Patent: Apr. 16, 2024

(54) HOME PORT AND SUBSTRATE PROCESSING APPARATUS USING SAME

(71) Applicant: SEMES CO., LTD., Cheonan-si (KR)

(72) Inventors: Young Jun Son, Cheonan-si (KR); Tae Hoon Lee, Osan-si (KR); Hyun Yoon, Hwaseong-si (KR); Do Yeon Kim, Yongin-si (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 18/084,381

(22) Filed: Dec. 19, 2022

(65) Prior Publication Data

US 2023/0195030 A1 Jun. 22, 2023

(30) Foreign Application Priority Data

Dec. 20, 2021 (KR) .................. 10-2021-0182756

(51) Int. Cl.
| | |
|---|---|
| G03G 21/00 | (2006.01) |
| G03G 15/00 | (2006.01) |
| G03G 15/02 | (2006.01) |
| G03G 21/18 | (2006.01) |

(52) U.S. Cl.
CPC ..... *G03G 21/1842* (2013.01); *G03G 15/0233* (2013.01); *G03G 15/60* (2013.01); *G03G 15/80* (2013.01); *G03G 2215/0872* (2013.01); *G03G 2221/0084* (2013.01); *G03G 2221/1651* (2013.01)

(58) Field of Classification Search
USPC .......................................... 399/38
See application file for complete search history.

(56) References Cited

U.S. PATENT DOCUMENTS

2017/0014840 A1 1/2017 Ueno et al.

FOREIGN PATENT DOCUMENTS

| | | |
|---|---|---|
| JP | 2008-168223 | 7/2008 |
| JP | 2019-25769 | 2/2019 |
| KR | 10-1999-0074080 | 10/1999 |
| KR | 10-2016-0081299 | 7/2016 |
| KR | 10-2016-0081300 | 7/2016 |
| KR | 10-2016-0133498 | 11/2016 |
| KR | 10-2017-0072390 | 6/2017 |
| KR | 10-2019-0041159 | 4/2019 |
| KR | 2019100041159 A * | 4/2019 |

OTHER PUBLICATIONS

Office Action from the Korean Intellectual Property Office dated Aug. 11, 2023.

* cited by examiner

*Primary Examiner* — Quana Grainger

(57) ABSTRACT

Proposed are a home port and a substrate processing apparatus using the same. The home port is installed in the substrate processing apparatus to temporarily mount a nozzle for discharging a process liquid to a substrate, and includes a main body having a space therein, a nozzle holder provided at an upper portion of the main body and configured to mount the nozzle, an inclined surface formed below the nozzle holder in the space, a first supply pipe configured to discharge a rinse liquid to a tip of the nozzle, a second supply pipe configured to inject the rinse liquid into the main body, a conductive wire configured to electrically connect the inclined surface and the first supply pipe, and a first switch installed on the conductive wire.

20 Claims, 9 Drawing Sheets

HOME PORT AND SUBSTRATE PROCESSING APPARATUS USING SAME

CROSS REFERENCE TO RELATED APPLICATION

The present application claims priority to Korean Patent Application No. 10-2021-0182756, filed Dec. 20, 2022, the entire contents of which is incorporated herein for all purposes by this reference.

BACKGROUND OF THE INVENTION

Field of the Invention

The present disclosure relates to a home port and a substrate processing apparatus using the same.

Description of the Related Art

Photolithography, which is a part of a semiconductor fabrication process, is a process of forming a desired pattern on a wafer. The photolithography process is performed by a substrate processing apparatus that continuously performs coating, exposure, and development.

Meanwhile, the substrate processing apparatus includes a home port. The home port includes a holder for mounting a nozzle that discharges a coating liquid or a developer to a wafer during a coating process or a development process, and a receiving space for accommodating a process liquid (liquid necessary for the process, such as coating liquid or developer), which is periodically discharged, in order to prevent contamination of the process liquid. In addition, the home port also includes an exhaust hole for discharging fumes generated from the process liquid discharged from the nozzle and a cleaning liquid supplying means for cleaning the discharged process liquid.

The gaseous fumes generated from the process liquid discharged from the nozzle can be deposited on the nozzle by static electricity, and is difficult to remove because it is deposited electrostatically.

The foregoing is intended merely to aid in the understanding of the background of the present disclosure, and is not intended to mean that the present disclosure falls within the purview of the related art that is already known to those skilled in the art.

SUMMARY OF THE INVENTION

Accordingly, the present disclosure has been made keeping in mind the above problems occurring in the related art, and an objective of the present disclosure is to provide a home port capable of preventing fumes generated inside the home port from being deposited on the surface of a nozzle due to static electricity, and a substrate processing apparatus using the same.

In order to achieve the above objective, according to one aspect of the present disclosure, there is provided a home port installed in a substrate processing apparatus to temporarily mount a nozzle for discharging a process liquid to a substrate, the home port including: a main body having a space therein; a nozzle holder provided at an upper portion of the main body and configured to mount the nozzle; an inclined surface formed below the nozzle holder in the space; a first supply pipe configured to discharge a rinse liquid to a tip of the nozzle; a second supply pipe configured to inject the rinse liquid into the main body; a conductive wire configured to electrically connect the inclined surface and the first supply pipe; and a first switch installed on the conductive wire.

The home port may further include: a ground wire configured to electrically connect the inclined surface and a ground electrode to discharge electric charges conducted on the inclined surface; and a second switch installed on the ground wire.

The first supply pipe may be composed of a plurality of pipes.

The first supply pipe may be treated with plating or ion implantation.

The first supply pipe may be positively charged when the inclined surface is negatively charged by the positively charged process liquid discharged from the nozzle and electric charges move along the conductive wire thereby, the first supply pipe may be maintained in a charged state when the first supply pipe is electrically disconnected by the first switch installed on the conductive wire, and the rinse liquid positively charged by the first supply pipe may be discharged to the nozzle so that a surface of the nozzle is positively charged, thereby preventing deposition of charged fumes.

The rinse liquid may be a thinner.

According to another aspect of the present disclosure, there is provided a substrate processing apparatus including: a housing a processing space therein; a substrate support unit supporting a substrate in the housing; a liquid supply unit having a nozzle configured to supply a processing liquid to the substrate; and a home port located outside the housing, configured to allow the nozzle to wait therein, and configured to discharge the processing liquid discharged by the nozzle to outside, wherein the home port may include: a main body having a space therein; a nozzle holder provided at an upper portion of the main body and configured to mount the nozzle; an inclined surface formed below the nozzle holder in the space; a first supply pipe configured to discharge a rinse liquid to a tip of the nozzle; a second supply pipe configured to inject the rinse liquid into the main body; a conductive wire configured to electrically connect the inclined surface and the first supply pipe; and a first switch installed on the conductive wire.

The substrate processing apparatus may further include: a ground wire configured to electrically connect the inclined surface and a ground electrode to discharge electric charges conducted on the inclined surface; and a second switch installed on the ground wire.

The first supply pipe may be composed of a plurality of pipes.

The first supply pipe may be treated with plating or ion implantation.

The first supply pipe may be positively charged when the inclined surface is negatively charged by the positively charged process liquid discharged from the nozzle and electric charges move along the conductive wire thereby, the first supply pipe may be maintained in a charged state when the first supply pipe is electrically disconnected by the first switch installed on the conductive wire, and the rinse liquid positively charged by the first supply pipe may be discharged to the nozzle so that a surface of the nozzle is positively charged, thereby preventing deposition of charged fumes.

According to still another aspect of the present disclosure, there is provided a home port installed in a substrate processing apparatus to temporarily mount a nozzle for discharging a process liquid to a substrate, the home port including: a main body having a space therein; a nozzle holder provided at an upper portion of the main body and configured to mount the nozzle; an inclined surface formed below the nozzle holder in the space; a first supply pipe configured to discharge a rinse liquid to a tip of the nozzle; a second supply pipe configured to inject the rinse liquid into the main body; a conductive wire configured to electrically connect the inclined surface and the first supply pipe; a first switch installed on the conductive wire; a ground wire configured to electrically connect the inclined surface and a ground electrode to discharge electric charges conducted on the inclined surface; and a second switch installed on the ground wire, wherein the first supply pipe may be composed of a plurality of pipes treated with plating or ion implantation, the first supply pipe may be positively charged when the inclined surface is negatively charged by the positively charged process liquid discharged from the nozzle and electric charges move along the conductive wire thereby, the first supply pipe may be maintained in a charged state when the first supply pipe is electrically disconnected by the first switch installed on the conductive wire, and the rinse liquid positively charged by the first supply pipe may be discharged to the nozzle so that a surface of the nozzle is positively charged, thereby preventing deposition of charged fumes.

According to the present disclosure, it is possible to provide a home port capable of preventing fumes generated inside the home port from being deposited on the surface of a nozzle due to static electricity, and a substrate processing apparatus using the same.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, a home port and a substrate processing apparatus using the same according to exemplary embodiments of the present disclosure will be described with reference to the drawings to provide specific contents for practicing the present disclosure.

The present disclosure includes two aspects, a home port and a substrate processing apparatus. The home port will be described first, and then the substrate processing apparatus having the home port will be described.

First, a home port 900 according to an embodiment of the present disclosure will be described with reference to the drawings.

Figure 1:
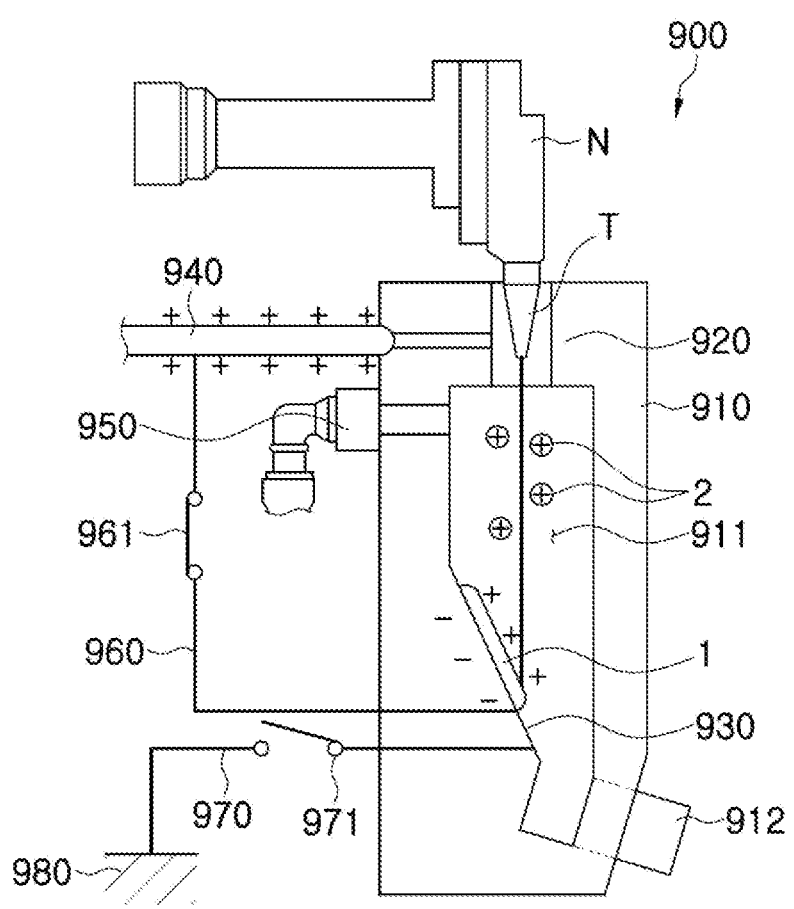
FIGS. 1, 3, and 5 are views illustrating a home port according to an embodiment of the present disclosure.
Figure 2A:
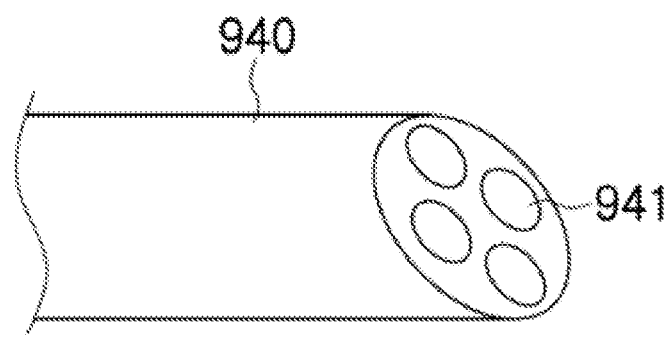
FIGS. 2A and 2B are views each illustrating an example of a first supply pipe illustrated in FIG. 1.
Figure 2B:
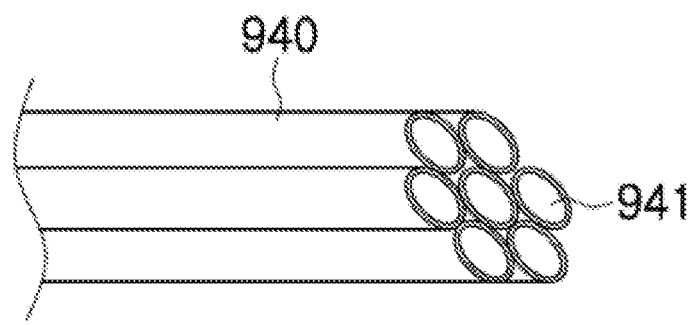
Figure 3:
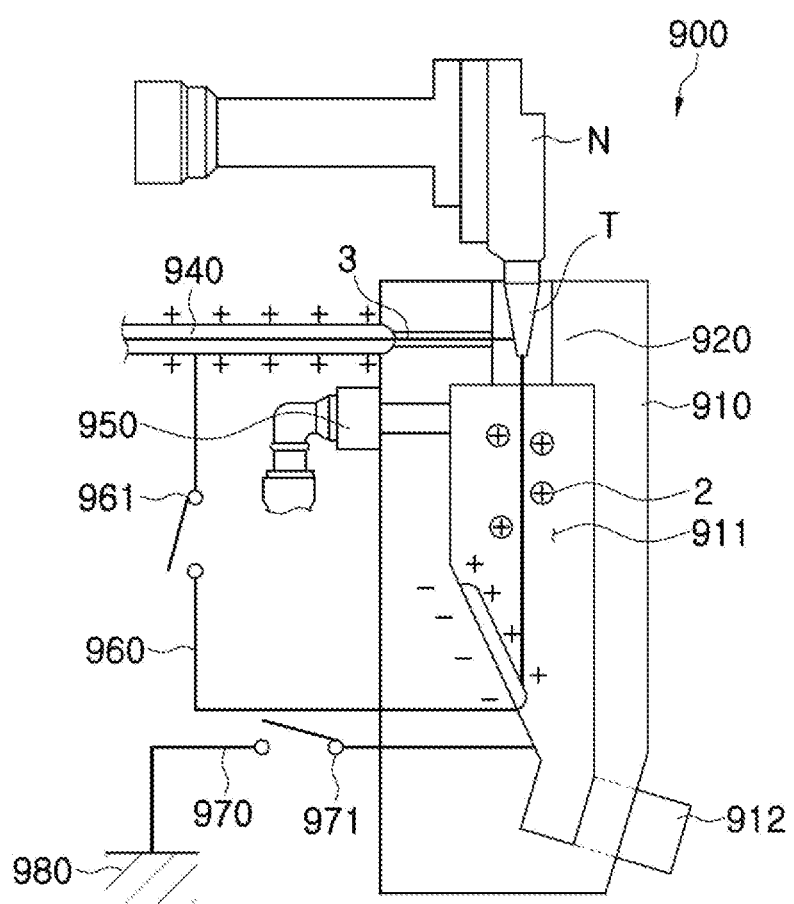
Figure 4:
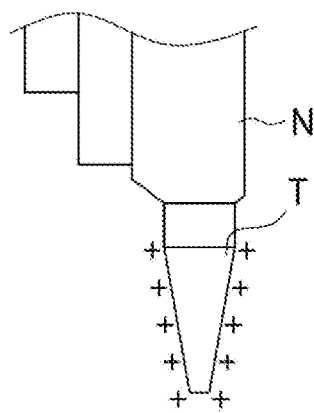
FIG. 4 is a view illustrating a state in which a tip of a nozzle illustrated in FIG. 1 is charged.
Figure 5:
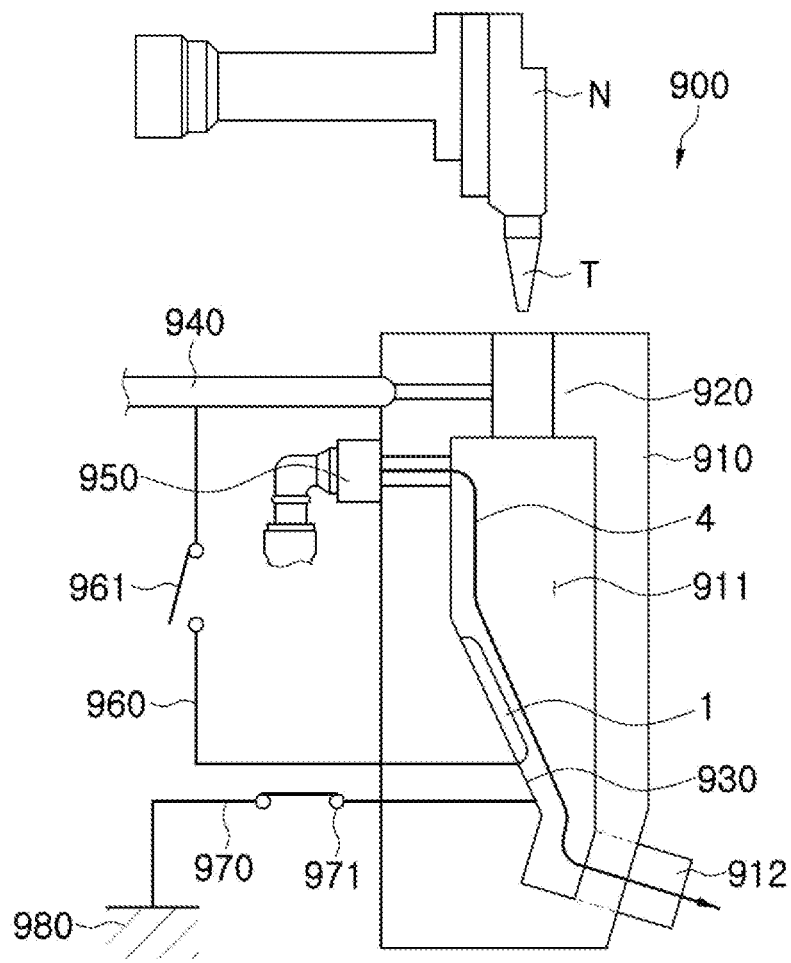

FIGS. 1, 3, and 5 are views illustrating the home port 900 according to the embodiment of the present disclosure. FIGS. 2A and 2B are views each illustrating an example of a first supply pipe 940 illustrated in FIG. 1. FIG. 4 is a view illustrating a state in which a tip T of a nozzle N illustrated in FIG. 1 is charged.

The home port 900 according to the present embodiment is installed in a substrate processing apparatus which will be described later to temporarily store the nozzle N for discharging a process liquid 1 to a substrate when not in use, and includes a main body 910, a nozzle holder 920, an inclined surface 930, the first supply pipe 940, a second supply pipe 950, a conductive wire 960, a first switch 961, a ground wire 970, and a second switch 971. The process liquid 1 is a generic term for liquids used in processes, such as a developer and a coating liquid used in a substrate processing apparatus.

As illustrated in FIG. 1, the main body 910 is a configuration having a space 911 therein, and has, at a lower portion thereof, a discharge hole 912 for discharging the process liquid 1 periodically discharged from the nozzle N and a rinse liquid for cleaning the process liquid. As the rinse liquid, a thinner may be used.

The nozzle holder 920 is provided at an upper portion of the main body 910 and is a part on which the nozzle N is mounted.

The inclined surface 930 is an inclined surface formed below the nozzle holder 920 in the space 911 of the main body 910. When the nozzle N periodically discharges the process liquid 1, which may be contaminated by contact with air, the discharged process liquid 1 flows along the inclined surface 930.

The first supply pipe 940 is a pipe for discharging the rinse liquid 3 toward the tip T of the nozzle N, and passes through the main body 910 to make contact with the tip T of the nozzle N.

As the first supply pipe 940, a pipe treated with plating or ion implantation is used in order to be charged more easily.

In addition, the first supply pipe 940 is composed of a plurality of pipes, and for example, may be configured in a form illustrated in FIG. 2A or 2B. FIG. 2A illustrates a form in which a plurality of through-holes are formed in one pipe, and FIG. 2B illustrates a form in which a plurality of pipes are combined. The meaning of being composed of a plurality of pipes includes both of these types. The reason that the first supply pipe 940 is composed of the plurality of pipes as described above is to increase a contact area with the rinse liquid 3 supplied through the first supply pipe 940 to ensure that the rinse liquid 3 can be charged efficiently.

The second supply pipe 950 is a pipe for injecting the rinse liquid 4 into the main body 910, and passes through the main body 910 as in the case of the first supply pipe 940.

The conductive wire 960 is a wire electrically connecting the inclined surface 930 and the first supply pipe 940. The first switch 961 is installed on the conductive wire 960 to form or block an electrical connection between the inclined surface 930 and the first supply pipe 940.

The ground wire 970 is a wire electrically connecting the inclined surface 930 and a ground electrode 980. The second switch 971 is installed on the ground wire 970 to form or block an electrical connection between the inclined surface 930 and the ground electrode 980.

Hereinafter, a mechanism for preventing deposition of fumes 2 on the tip T of the nozzle N by the above-described configuration will be described.

First, as illustrated in FIG. 1, the process liquid 1 is discharged from the nozzle N in a state in which the first switch 961 is ON and the second switch 971 is OFF. As illustrated in the figure, the process liquid 1 is positively charged (+), so that electrons of the first supply pipe 940 move to the inclined surface 930 along the conductive wire 960, and the inside of the inclined surface 930 is negatively charged (−).

Accordingly, the first supply pipe 940 is positively charged (+). In this state, as illustrated in FIG. 3, when the first switch 961 is turned OFF (the second switch 971 is still OFF), the electrons cannot move, so that the first supply pipe 940 is maintained in a charged state. At this time, when the rinse liquid 3 is supplied through the first supply pipe 940, electrons of the rinse liquid 3 move to the first supply pipe 940, so that the rinse liquid 3 is positively charged (+).

When the rinse liquid 3 positively charged (+) is discharged to the tip T of the nozzle N, the surface of the tip T is positively charged (+) as illustrated in FIG. 4.

As illustrated in FIGS. 1 and 3, since the fumes 2 are positively charged (+) and the surface of the tip T is also positively charged (+), the fumes 2 are prevented from being deposited on the surface of the tip T by an electrostatic repulsive force.

Meanwhile, when there is a need to clean the inside of the main body 910, as illustrated in FIG. 5, the rinse liquid 4 is injected into the main body 910 through the second supply pipe 950 in a state in which the nozzle N is outside the main body 910. At this time, the second switch 971 is turned ON while the first switch 961 is OFF to electrically neutralize the inclined surface 930 to change to an uncharged state. In this case, supplying the rinse liquid 4 while the nozzle N is outside the main body 910 so that the rinse liquid 4 does not adhere to the nozzle N is expected to have an effect of preventing the tip T of the nozzle N from being negatively charged (−).

Hereinafter, a substrate processing apparatus according to a second aspect of the present disclosure will be described.

A facility of this embodiment may be used to perform a photolithography process on a substrate such as a semiconductor wafer or a flat panel display panel. In particular, the facility of this embodiment may be connected to an exposure device and used to perform a coating process and a development process on a substrate.

Hereinafter, a case in which a wafer is used as a substrate will be described as an example.

Figure 6:
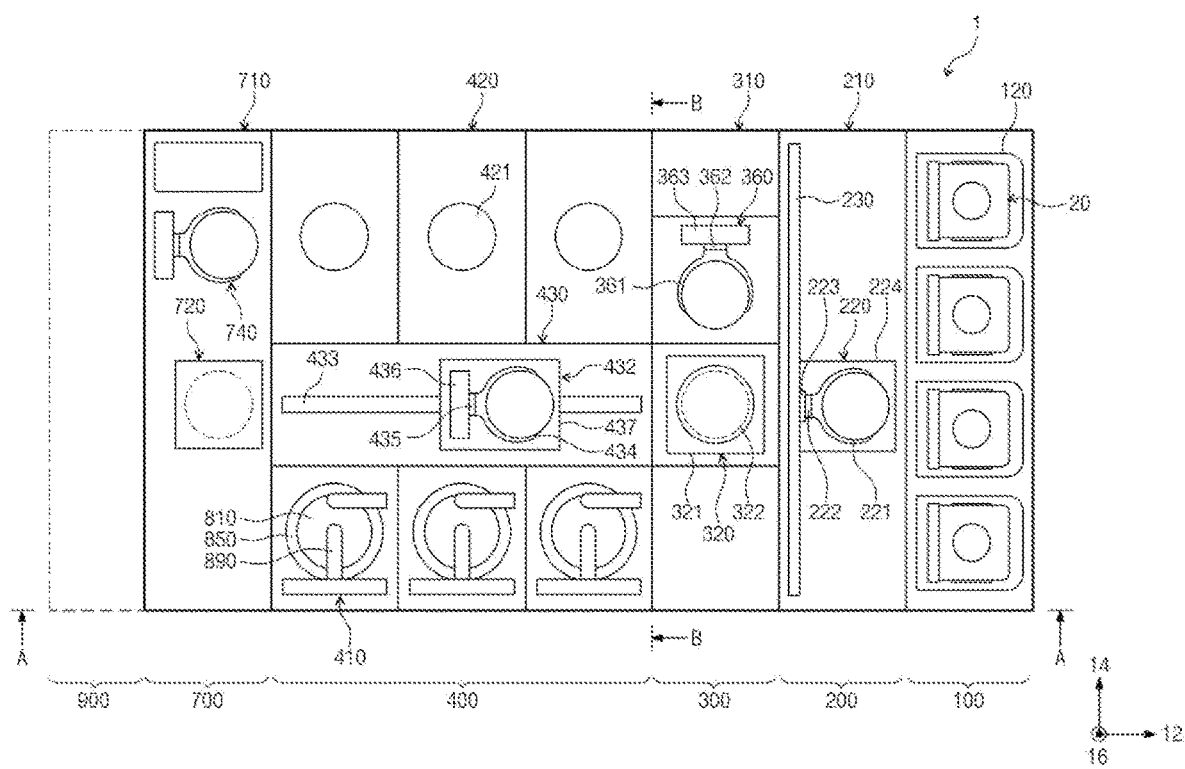
FIG. 6 is a view illustrating a substrate processing facility as viewed from above.
Figure 7:
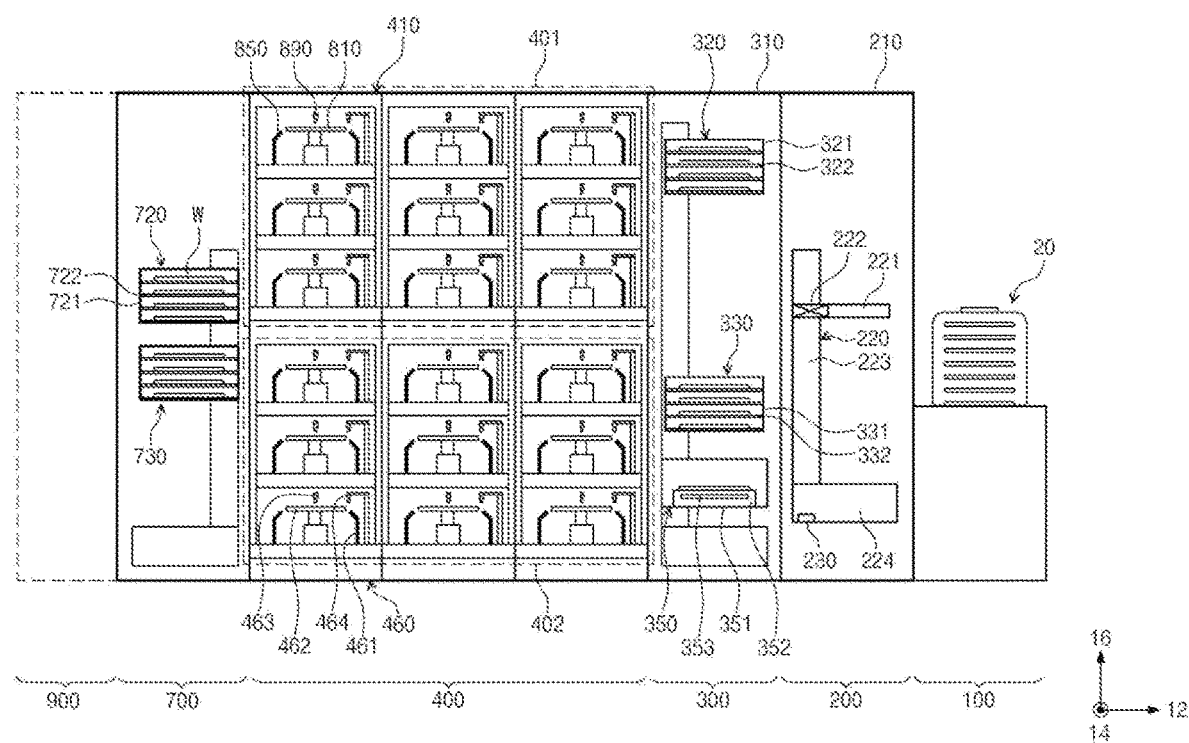
FIG. 7 is a view illustrating the facility illustrated in FIG. 6 as viewed from direction A-A.
Figure 8:
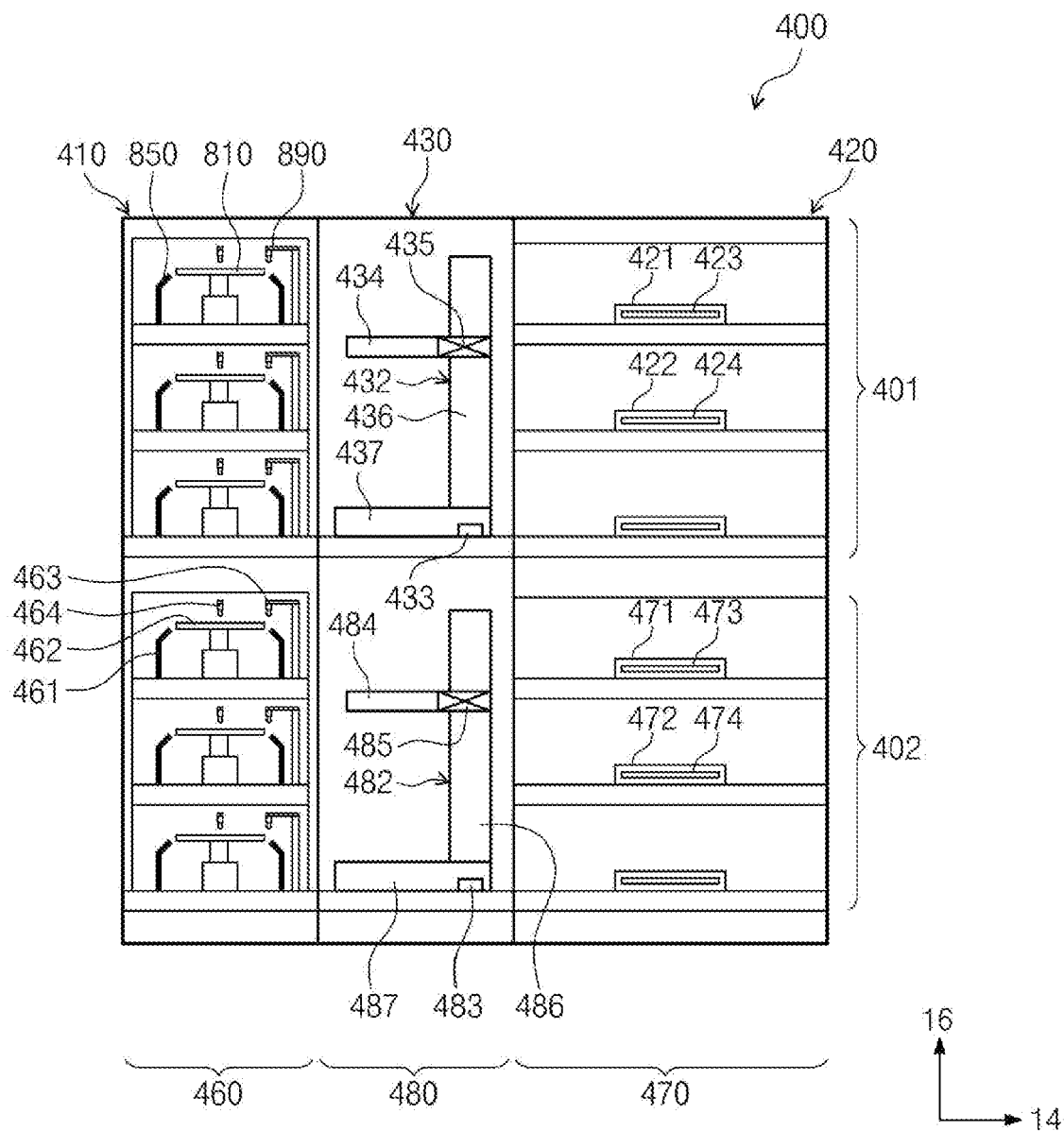
FIG. 8 is a view illustrating the facility illustrated in FIG. 6 as viewed from direction B-B.

FIG. 6 is a view illustrating a substrate processing facility 1 as viewed from above. FIG. 7 is a view illustrating the facility 1 illustrated in FIG. 6 as viewed from direction A-A. FIG. 8 is a view illustrating the facility 1 illustrated in FIG. 6 as viewed from direction B-B.

Referring to FIGS. 6 to 8, the substrate processing facility 1 includes a load port 100, an index module 200, a buffer module 300, a coating and development module 400, and an interface module 700. The load port 100, the index module 200, the buffer module 300, the coating and development module 400, and the interface module 700 are sequentially arranged in a line in one direction.

Hereinafter, the direction in which the load port 100, the index module 200, the buffer module 300, the coating and development module 400, and the interface module 700 are arranged is referred to as a first direction 12, a direction orthogonal to the first direction 12 when viewed from above is referred to as a second direction 14, and a direction orthogonal to each of the first direction 12 and the second direction 14 is referred to as a third direction 16.

A substrate W is moved in a state accommodated in a cassette 20. In this case, the cassette 20 has a structure that can be hermetically sealed from the outside. For example, as the cassette 20, a front open unified pod (FOUP) having a door at a front side thereof may be used.

Hereinafter, the load port 100, the index module 200, the buffer module 300, the coating and development module 400, and the interface module 700 will be described in detail.

The load port 100 has a mounting table 120 on which the cassette 20 in which a plurality of substrates W are accommodated is placed. A plurality of mounting tables 120 are provided, and the mounting tables 200 are arranged in a line along the second direction 14. In FIG. 6, four mounting tables 120 are illustrated.

The index module 200 transfers the substrate W between the buffer module 300 and the cassette 20 placed on the mounting table 120 of the load port 100. The index module 200 includes a frame 210, an index robot 220, and a guide rail 230. The frame 210 is provided in a substantially rectangular parallelepiped shape with an empty inside, and is disposed between the load port 100 and the buffer module 300. The frame 210 of the index module 200 may be provided at a lower height than a frame 310 of the buffer module 300 which will be described later. The index robot 220 and the guide rail 230 are disposed in the frame 210. The index robot 220 has a four-axis driving structure that enables a hand 221 directly handling the substrate W to be moved and rotated in the first direction 12, the second direction 14, and the third direction 16. The index robot 220 includes the hand 221, an arm 222, a support 223, and a base 224. The hand 221 is fixedly installed on the arm 222. The arm 222 is provided in a telescoping structure and a rotatable structure. The support 223 is disposed so that its longitudinal direction corresponds to the third direction 16. The arm 222 is coupled to the support 223 so as to be movable along the support 223. The support 223 is fixedly coupled to the base 224. The guide rail 230 is disposed so that its longitudinal direction is parallel to the second direction 14. The base 224 is coupled to the guide rail 230 so as to be linearly movable along the guide rail 230. In addition, although not illustrated, the frame 210 is further provided with a door opener for opening and closing the door of the cassette 20.

The buffer module 300 includes the frame 310, a first buffer 320, a second buffer 330, a cooling chamber 350, and a buffer robot 360. The frame 310 is provided in a substantially rectangular parallelepiped shape with an empty inside, and is disposed between the index module 200 and the coating and development module 400. The first buffer 320, the second buffer 330, the cooling chamber 350, and the buffer robot 360 are positioned in the frame 310. The cooling chamber 350, the second buffer 330, and the first buffer 320 are sequentially arranged from below along the third direction 16. The first buffer 320 is located at a height corresponding to a coating module 401 of the coating and development module 400 which will be described later. The second buffer 330 and the cooling chamber 350 are located at a height corresponding to a development module 402 of the coating and development module 400 which will be described later. The buffer robot 360 is located to be spaced apart from the second buffer 330, the cooling chamber 350, and the first buffer 320 by a predetermined distance in the second direction 14.

Each of the first buffer 320 and the second buffer 330 temporarily stores a plurality of substrates W. The second buffer 330 includes a housing 331 and a plurality of supports 332. The supports 332 are arranged in the housing 331, and are provided to be spaced apart from each other in the third direction 16. One substrate W is placed on each of the supports 332. The housing 331 has an opening (not illustrated) in each of a direction in which the index robot 220 is provided, a direction in which the buffer robot 360 is provided, and a direction in which a development robot 482 of the development module 402 which will be described later can is provided so that the index robot 220, the buffer robot 360, and the development robot 482 can load or unload the substrate W to or from each of the supports 332 in the housing 331. The first buffer 320 has a structure substantially similar to that of the second buffer 330. However, the housing 321 of the first buffer 320 has an opening in a direction in which the buffer robot 360 is provided and a direction in which a coating robot 432 of the coating module 401 which will be described later is provided. The first buffer 320 includes a plurality of supports 322. The number of the supports 332 provided in the first buffer 320 and the number of the supports 332 provided in the second buffer 330 may be the same or different. According to an example, the number of the supports 332 provided in the second buffer 330 may be greater than that of the supports 322 provided in the first buffer 320.

The buffer robot 360 transfers the substrate W between the first buffer 320 and the second buffer 330. The buffer robot 360 includes a hand 361, an arm 362, and a support 363. The hand 361 is fixedly installed on the arm 362. The arm 362 is provided in a telescoping structure so that the hand 361 is movable in the second direction 14. The arm 362 is coupled to the support 363 so as to be linearly movable along the support 363 in the third direction 16. The support 363 has a length extending from a position corresponding to the second buffer 330 to a position corresponding to the first buffer 320. The support 363 may be provided longer than the length in an upward or downward direction. The buffer robot 360 may be provided such that the hand 361 is only driven in two axes along the second direction 14 and the third direction 16.

The cooling chamber 350 cools the substrate W. The cooling chamber 350 has a housing 351 and a cooling plate 352. The cooling plate 352 includes an upper surface on which the substrate W is placed, and a cooling means 353 for cooling the substrate W. As the cooling means 353, various methods such as cooling by means of cooling water or cooling by means of a thermoelectric element may be used. In addition, a lift pin assembly (not illustrated) for positioning the substrate W on the cooling plate 352 may be provided in the cooling chamber 350. The housing 351 has an opening (not illustrated) in each of a direction in which the index robot 220 is provided and a direction in which the development robot 482 of the development module 402 which will be described later is provided so that the index robot 220 and the development robot 482 can load or unload the substrate W onto or from the cooling plate 352. In addition, the cooling chamber 350 may be provided with a plurality of doors (not illustrated) each for opening and closing the aforementioned opening.

The coating and development module 400 performs a process of applying a photoresist on the substrate W before an exposure process and a process of developing the substrate W after the exposure process. The coating and development module 400 has a substantially rectangular parallelepiped shape. The coating and development module 400 includes the coating module 401 and the development module 402. The coating and development module 400 includes the coating module 401 and the development module 402. According to an example, the coating module 401 is located above the development module 402.

The coating module 401 performs a process of applying a photosensitive liquid such as a photoresist on the substrate W, and a heat treatment process such as heating and cooling of the substrate W before and after a resist coating process. The coating module 401 includes a resist coating chamber 410, a bake chamber 420, and a transfer chamber 430. The resist coating chamber 410, the bake chamber 420, and the transfer chamber 430 are sequentially arranged along the second direction 14. Therefore, the resist coating chamber 410 and the bake chamber 420 are spaced apart from each other in the second direction 14 with the transfer chamber 430 interposed therebetween. A plurality of resist coating chambers 410 are provided in each of the first direction 12 and the third direction 16. A plurality of bake chambers 420 are provided in each of the first direction 12 and the third direction 16.

The transfer chamber 430 is located in parallel with the first buffer 320 of the buffer module 300 in the first direction 12. The coating robot 432 and a guide rail 433 are located in the transfer chamber 430. The transfer chamber 430 has a substantially rectangular shape.

The coating robot 432 transfers the substrate W between the bake chambers 420, the resist coating chambers 400, and the first buffer 320 of the buffer module 300. The guide rail 433 is disposed so that its longitudinal direction is parallel to the first direction 12. The guide rail 433 guides the coating robot 432 to move linearly in the first direction 12. The coating robot 432 includes a hand 434, an arm 435, a support 436, and a base 437. The hand 434 is fixedly installed on the arm 435. The arm 435 is provided in a telescoping structure so that the hand 434 is movable in a horizontal direction. The support 436 is disposed so that its longitudinal direction is parallel to the third direction 16. The arm 435 is coupled to the support 436 so as to be linearly movable along the support 436 in the third direction 16. The support 436 is fixedly coupled to the base 437. The base 437 is coupled to the guide rail 433 so as to be linearly movable along the guide rail 433.

Figure 9:
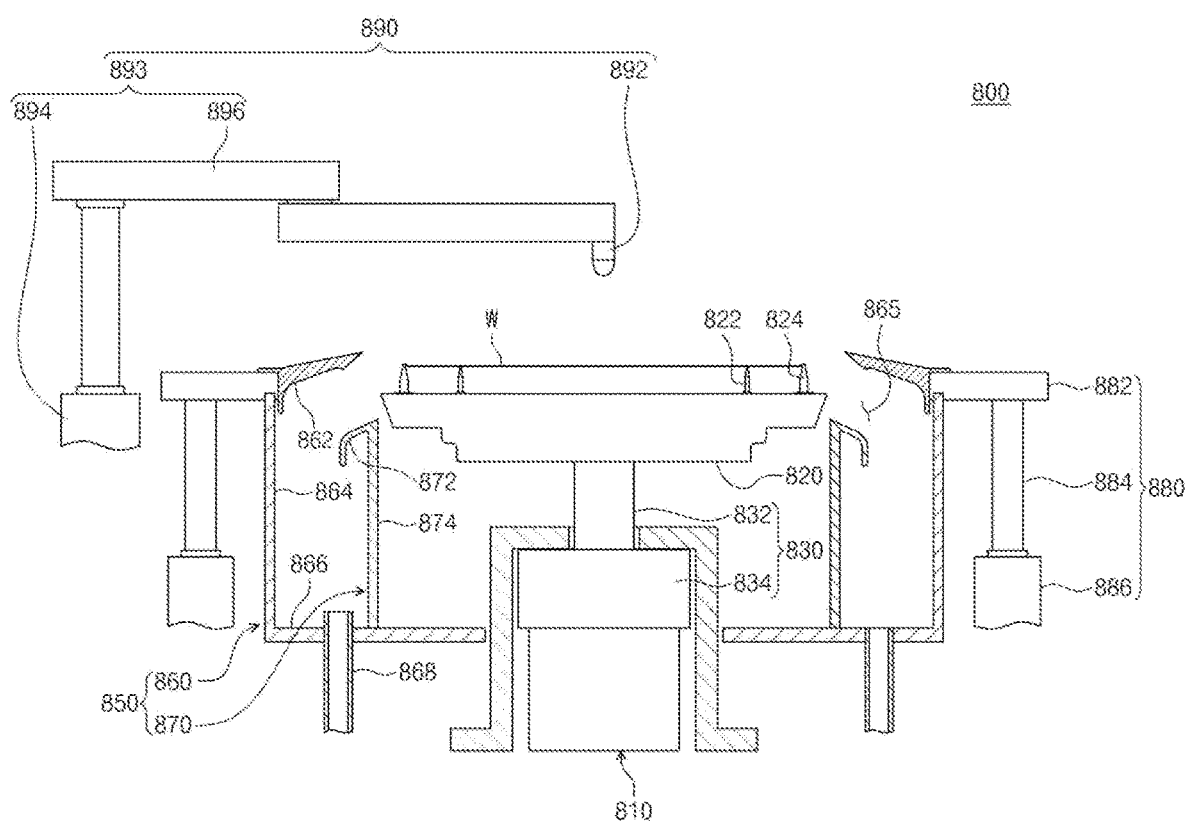
FIG. 9 is a sectional view illustrating a substrate processing apparatus provided in a resist coating chamber illustrated in FIG. 6.
Figure 10:
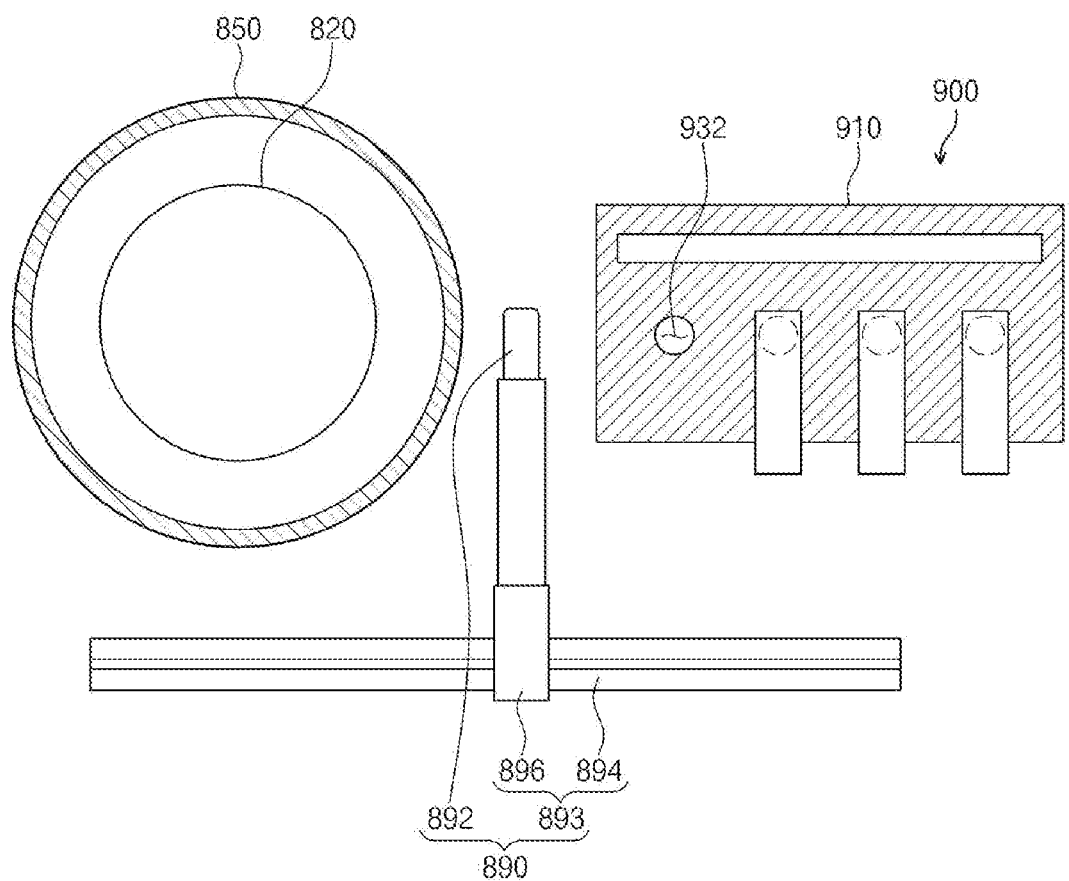
FIG. 10 is a plan view illustrating the substrate processing apparatus illustrated in FIG. 9.

The resist coating chambers 410 all have the same structure. However, each of the resist coating chambers 410 may use a different type of photoresist. As an example, a chemical amplification resist may be used as the photoresist. Each of the resist coating chambers 410 is provided as a substrate processing apparatus for applying a photoresist on the substrate W. FIG. 9 is a sectional view illustrating a substrate processing apparatus 800 provided in the resist coating chamber 410 illustrated in FIG. 6. FIG. 10 is a plan view illustrating the substrate processing apparatus 800 illustrated in FIG. 9. Referring to FIGS. 9 and 10, the substrate processing apparatus 800 includes a housing 850, a substrate support unit 810, a lifting unit 880, a liquid supply unit 890, and a home port 900.

The housing 850 has a processing space in which a coating process is performed. The housing 850 is provided in a cylindrical shape with an open top. The housing 850 includes a recovery container 860 and a guide wall 870. The recovery container 860 is provided in an annular ring shape surrounding the substrate support unit 810. The guide wall 870 is provided in an annular ring shape surrounding the substrate support unit 810 inside the recovery container 860. A space between the recovery container 860 and the guide wall 870 serves as a recovery space 865 in which a processing liquid is recovered. A recovery line 868 is connected to a lower surface of the recovery container 860. The recovery line 868 discharges the processing liquid introduced into the recovery container 860 to the outside. The discharged processing liquid may be reused through a processing liquid regeneration system (not illustrated).

The recovery container 860 includes a first inclined wall 862, a vertical wall 864, and a bottom wall 866. The first inclined wall 862 is provided to surround the substrate support unit 810. The first inclined wall 862 is provided to be inclined downwards in a direction away from the substrate support unit 810. The vertical wall 864 vertically extends from a lower end of the first inclined wall 862 in a downward direction orthogonal to the ground surface. The bottom wall 866 horizontally extends from a lower end of the vertical wall 864 in a direction toward the central axis of the substrate support unit 810.

The guide wall 870 is located between the first inclined wall 862 and the bottom wall 866. The guide wall 870 includes a second inclined wall 872 and an intervening wall 874. The second inclined wall 872 is provided to surround the substrate support unit 810. The second inclined wall 872 is provided to be inclined downwards in a direction away from the substrate support unit 810. An upper end of the second inclined wall 872 and an upper end of the first inclined wall 862 are provided to coincide with each other in a vertical direction. The intervening wall 874 vertically extends downwards from the upper end of the second inclined wall 872. The intervening wall 874 connects the second inclined wall 872 and the bottom wall 866 to each other.

The substrate support unit 810 supports and rotates a substrate W in the housing 850. The substrate support unit 810 includes a support plate 820 and an actuating member 830. Pin members 822 and 824 supporting the substrate W are coupled to an upper surface of the support plate 820. A plurality of support pins 822 support a lower surface of the substrate W, and a plurality of chuck pins 824 support a side surface of the substrate W. The support plate 820 is rotatable by the actuating member 830. The actuating member 830 includes an actuating shaft 832 and an actuator 834.

The actuating shaft 834 is coupled to a lower surface of the support plate 820. The actuator 834 provides a rotational force to the actuating shaft 832. For example, the actuator 834 may be a motor.

The lifting unit 880 lifts and lowers the housing 850 in the vertical direction, and adjusts a relative height between the housing 850 and the substrate support unit 810. The lifting unit 880 includes a bracket 882, a moving shaft 884, and an actuator 886. The bracket 882 is fixedly installed on an inclined wall of the housing 850. The moving shaft 884 that is moved in the vertical direction by the actuator 886 is fixedly coupled to the bracket 882.

The liquid supply unit 890 supplies the processing liquid on the substrate W placed on the support plate 820. The liquid supply unit 890 includes a nozzle 892 for supplying the processing liquid to the substrate W and a nozzle moving member 893. A plurality of nozzles 892 are provided. A processing liquid supply line is connected to each of the nozzles 892. The plurality of nozzles 892 wait at the home port 900. One of the nozzles 892 is movable to a process position and a standby position by the nozzle moving member 893. Here, the process position is a position where the nozzle 892 faces the substrate W placed on the support plate 820. The standby position is a position where the nozzle 892 waits at the home port 900. For example, the processing liquid may be a liquid having electrical properties. The processing liquid may be charged particles. The processing liquid may be a photosensitive liquid such as a photoresist.

The nozzle moving member 893 includes a guide rail 894, an arm 896, and an actuator (not illustrated). The guide rail 894 is located at a side of the housing 850. The guide rail 894 is disposed such that its longitudinal direction is parallel to the first direction 12. The arm 896 is installed on the guide rail 894. The arm 896 is provided in a bar shape. The arm 896 has a first end fixedly installed on the guide rail 894, and a second end provided with the nozzle 892 detachably provided. The actuator (not illustrated) may provide a driving force to the guide rail 894 to reciprocate the arm 896 and the nozzle 892 in the first direction 12 or an opposite direction thereof. The arm 896 and the nozzle 892 mounted thereon are movable to the process position and the standby position by the guide rail 894 and the actuator (not illustrated). For example, the actuator (not illustrated) may be a motor.

The home port 900 is a configuration in which the nozzles 892 that do not perform the coating process wait or are stored. Since the home port 900 has been sufficiently described above, an additional description thereof will be omitted.

Although preferred embodiments of the present disclosure have been described for illustrative purposes, those skilled in the art will appreciate that various modifications, additions, and substitutions are possible, without departing from the scope and spirit of the present disclosure as disclosed in the accompanying claims.

What is claimed is:

1. A home port installed in a substrate processing apparatus to temporarily mount a nozzle for discharging a process liquid to a substrate, the home port comprising:
    a main body having a space therein;
    a nozzle holder provided at an upper portion of the main body and configured to mount the nozzle;
    an inclined surface formed below the nozzle holder in the space;
    a first supply pipe configured to discharge a rinse liquid to a tip of the nozzle;
    a second supply pipe configured to inject the rinse liquid into the main body;
    a conductive wire configured to electrically connect the inclined surface and the first supply pipe; and
    a first switch installed on the conductive wire.

2. The home port of claim 1, further comprising:
    a ground wire configured to electrically connect the inclined surface and a ground electrode to discharge electric charges conducted on the inclined surface; and
    a second switch installed on the ground wire.

3. The home port of claim 1, wherein the first supply pipe is composed of a plurality of pipes.

4. The home port of claim 1, wherein the first supply pipe is treated with plating or ion implantation.

5. The home port of claim 3, wherein the first supply pipe is treated with plating or ion implantation.

6. The home port of claim 1, wherein the first supply pipe is positively charged when the inclined surface is negatively charged by positively charged process liquid discharged from the nozzle and electric charges move along the conductive wire thereby, the first supply pipe is maintained in a charged state when the first supply pipe is electrically disconnected by the first switch installed on the conductive wire, and the rinse liquid positively charged by the first supply pipe is discharged to the nozzle so that a surface of the nozzle is positively charged, thereby preventing deposition of charged fumes.

7. The home port of claim 3, wherein the first supply pipe is positively charged when the inclined surface is negatively charged by positively charged process liquid discharged from the nozzle and electric charges move along the conductive wire thereby, the first supply pipe is maintained in a charged state when the first supply pipe is electrically disconnected by the first switch installed on the conductive wire, and the rinse liquid positively charged by the first supply pipe is discharged to the nozzle so that a surface of the nozzle is positively charged, thereby preventing deposition of charged fumes.

8. The home port of claim 4, wherein the first supply pipe is positively charged when the inclined surface is negatively charged by positively charged process liquid discharged from the nozzle and electric charges move along the conductive wire thereby, the first supply pipe is maintained in a charged state when the first supply pipe is electrically disconnected by the first switch installed on the conductive wire, and the rinse liquid positively charged by the first supply pipe is discharged to the nozzle so that a surface of the nozzle is positively charged, thereby preventing deposition of charged fumes.

9. The home port of claim 5, wherein the first supply pipe is positively charged when the inclined surface is negatively charged by positively charged process liquid discharged from the nozzle and electric charges move along the conductive wire thereby, the first supply pipe is maintained in a charged state when the first supply pipe is electrically disconnected by the first switch installed on the conductive wire, and the rinse liquid positively charged by the first supply pipe is discharged to the nozzle so that a surface of the nozzle is positively charged, thereby preventing deposition of charged fumes.

10. The home port of claim 1, wherein the rinse liquid is a thinner.

11. A substrate processing apparatus comprising:
a housing a processing space therein;
a substrate support unit supporting a substrate in the housing;
a liquid supply unit having a nozzle configured to supply a processing liquid to the substrate; and
a home port located outside the housing, configured to allow the nozzle to wait therein, and configured to discharge the processing liquid discharged by the nozzle to outside,
wherein the home port comprises:
a main body having a space therein;
a nozzle holder provided at an upper portion of the main body and configured to mount the nozzle;
an inclined surface formed below the nozzle holder in the space;
a first supply pipe configured to discharge a rinse liquid to a tip of the nozzle;
a second supply pipe configured to inject the rinse liquid into the main body;
a conductive wire configured to electrically connect the inclined surface and the first supply pipe; and
a first switch installed on the conductive wire.

12. The substrate processing apparatus of claim 11, further comprising:
a ground wire configured to electrically connect the inclined surface and a ground electrode to discharge electric charges conducted on the inclined surface; and
a second switch installed on the ground wire.

13. The substrate processing apparatus of claim 11, wherein the first supply pipe is composed of a plurality of pipes.

14. The substrate processing apparatus of claim 11, wherein the first supply pipe is treated with plating or ion implantation.

15. The substrate processing apparatus of claim 13, wherein the first supply pipe is treated with plating or ion implantation.

16. The substrate processing apparatus of claim 11, wherein the first supply pipe is positively charged when the inclined surface is negatively charged by positively charged process liquid discharged from the nozzle and electric charges move along the conductive wire thereby, the first supply pipe is maintained in a charged state when the first supply pipe is electrically disconnected by the first switch installed on the conductive wire, and the rinse liquid positively charged by the first supply pipe is discharged to the nozzle so that a surface of the nozzle is positively charged, thereby preventing deposition of charged fumes.

17. The substrate processing apparatus of claim 13, wherein the first supply pipe is positively charged when the inclined surface is negatively charged by positively charged process liquid discharged from the nozzle and electric charges move along the conductive wire thereby, the first supply pipe is maintained in a charged state when the first supply pipe is electrically disconnected by the first switch installed on the conductive wire, and the rinse liquid positively charged by the first supply pipe is discharged to the nozzle so that a surface of the nozzle is positively charged, thereby preventing deposition of charged fumes.

18. The substrate processing apparatus of claim 14, wherein the first supply pipe is positively charged when the inclined surface is negatively charged by positively charged process liquid discharged from the nozzle and electric charges move along the conductive wire thereby, the first supply pipe is maintained in a charged state when the first supply pipe is electrically disconnected by the first switch installed on the conductive wire, and the rinse liquid positively charged by the first supply pipe is discharged to the nozzle so that a surface of the nozzle is positively charged, thereby preventing deposition of charged fumes.

19. The substrate processing apparatus of claim 15, wherein the first supply pipe is positively charged when the inclined surface is negatively charged by positively charged process liquid discharged from the nozzle and electric charges move along the conductive wire thereby, the first supply pipe is maintained in a charged state when the first supply pipe is electrically disconnected by the first switch installed on the conductive wire, and the rinse liquid positively charged by the first supply pipe is discharged to the nozzle so that a surface of the nozzle is positively charged, thereby preventing deposition of charged fumes.

20. A home port installed in a substrate processing apparatus to temporarily mount a nozzle for discharging a process liquid to a substrate, the home port comprising:
a main body having a space therein;
a nozzle holder provided at an upper portion of the main body and configured to mount the nozzle;
an inclined surface formed below the nozzle holder in the space;
a first supply pipe configured to discharge a rinse liquid to a tip of the nozzle;
a second supply pipe configured to inject the rinse liquid into the main body;
a conductive wire configured to electrically connect the inclined surface and the first supply pipe;
a first switch installed on the conductive wire;

a ground wire configured to electrically connect the inclined surface and a ground electrode to discharge electric charges conducted on the inclined surface; and a second switch installed on the ground wire, wherein the first supply pipe is composed of a plurality of pipes treated with plating or ion implantation, the first supply pipe is positively charged when the inclined surface is negatively charged by positively charged process liquid discharged from the nozzle and electric charges move along the conductive wire thereby, the first supply pipe is maintained in a charged state when the first supply pipe is electrically disconnected by the first switch installed on the conductive wire, and the rinse liquid positively charged by the first supply pipe is discharged to the nozzle so that a surface of the nozzle is positively charged, thereby preventing deposition of charged fumes.

\* \* \* \* \*